US007778341B2

(12) United States Patent
Tong et al.

(10) Patent No.: US 7,778,341 B2
(45) Date of Patent: Aug. 17, 2010

(54) SYSTEM AND METHOD PERFORMING QUADRATURE AMPLITUDE MODULATION BY COMBINING CO-SETS AND STRONGLY CODED CO-SET IDENTIFIERS

(75) Inventors: Wen Tong, Ottawa (CA); Amir Khandani, Kitchener (CA)

(73) Assignee: Nortel Networks Limited, St. Laurent, Quebec (CA)

(*) Notice: Subject to any disclaimer, the term of this patent is extended or adjusted under 35 U.S.C. 154(b) by 1986 days.

(21) Appl. No.: 10/226,174

(22) Filed: Aug. 23, 2002

(65) Prior Publication Data
US 2003/0039318 A1 Feb. 27, 2003

Related U.S. Application Data

(60) Provisional application No. 60/314,169, filed on Aug. 23, 2001, provisional application No. 60/314,168, filed on Aug. 23, 2001.

(51) Int. Cl.
H04L 5/12 (2006.01)
(52) U.S. Cl. ..................................................... 375/265
(58) Field of Classification Search ............... 375/298, 375/265, 316, 264, 262; 714/758, 786–796; 341/67
See application file for complete search history.

(56) References Cited

U.S. PATENT DOCUMENTS

| | | | |
|---|---|---|---|
| 3,612,843 A | 10/1971 | Aptroot-Soloway | |
| 5,115,453 A | 5/1992 | Calderbank et al. | |
| 5,388,124 A | 2/1995 | Laroia et al. | |
| 5,396,518 A * | 3/1995 | How | 375/265 |
| 5,832,044 A | 11/1998 | Sousa et al. | |
| 6,125,103 A | 9/2000 | Bauml et al. | |
| 6,166,667 A * | 12/2000 | Park | 341/94 |
| 6,208,274 B1 * | 3/2001 | Taori et al. | 341/67 |
| 6,266,795 B1 | 7/2001 | Wei | |

(Continued)

FOREIGN PATENT DOCUMENTS

EP 0540232 10/1992

(Continued)

OTHER PUBLICATIONS

Third Generation Partnership Project Two (3GPP2), 1xEV-DV Evaluation Methodology—Addendum (V6), Jul. 25, 2001.

(Continued)

Primary Examiner—Don N Vo

(57) ABSTRACT

A method of encoding a stream of data elements is provided which involves splitting the stream of data elements into a first stream and a second stream; encoding the first stream to produce a first encoded stream; performing a constellation mapping using a combination of the first encoded stream and a third stream which is based an the second stream. This may involve defining a signal constellation; defining a plurality of co-sets within the constellation such that a minimum distance between constellation points within each co-set is larger than a minimum distance between any constellation points within the signal constellation; performing said constellation mapping by using the first encoded stream to identify a sequence of co-sets of said plurality of co-sets, and by using the third stream to identify a sequence of constellation points within respective co-sets of the sequence of co-sets identified by said first encoded stream.

32 Claims, 8 Drawing Sheets

U.S. PATENT DOCUMENTS

| | | | |
|---|---|---|---|
| 6,515,980 | B1 | 2/2003 | Bottomley |
| 6,553,539 | B1* | 4/2003 | Markarian et al. .......... 714/790 |
| 6,574,211 | B2 | 6/2003 | Padovani et al. |
| 6,587,452 | B1* | 7/2003 | Davidovici et al. ......... 370/342 |
| 6,611,940 | B1* | 8/2003 | Markarian et al. .......... 714/790 |
| 6,651,210 | B1* | 11/2003 | Trott et al. .................. 714/758 |
| 6,671,832 | B1 | 12/2003 | Apisdorf |
| 6,928,066 | B1 | 8/2005 | Moon et al. |
| 7,020,833 | B2 | 3/2006 | Watanabe et al. |
| 2002/0031082 | A1 | 3/2002 | Lundby et al. |
| 2002/0031190 | A1* | 3/2002 | Ophir et al. ................. 375/265 |
| 2002/0101915 | A1* | 8/2002 | Zhang et al. ................ 375/222 |
| 2002/0172179 | A1 | 11/2002 | Grimsrud |
| 2003/0028843 | A1* | 2/2003 | Chang et al. ................ 714/786 |
| 2003/0053435 | A1 | 3/2003 | Sindhushayana et al. |
| 2003/0095498 | A1 | 5/2003 | Sato et al. |
| 2003/0206558 | A1* | 11/2003 | Parkkinen et al. ........... 370/477 |
| 2005/0047514 | A1* | 3/2005 | Bolinth et al. .............. 375/261 |

FOREIGN PATENT DOCUMENTS

| | | |
|---|---|---|
| EP | 0624018 | 4/1994 |
| EP | 0 540 232 B1 | 1/1998 |
| JP | 11205279 | 7/1999 |
| JP | 11215091 | 8/1999 |
| WO | WO9953662 | 4/1999 |
| WO | WO 99/53664 | 10/1999 |
| WO | WO 00/74249 A1 | 12/2000 |

OTHER PUBLICATIONS

Robertston, Patrick; Wörz, Thomas; Bandwith-Efficient Turbo Trellis-Coded Modualtion Using Punctured Component Codes; IEEE Journal on Selected Areas in Communications, vol. 16, No. 2, Feb. 1998, pp. 206-218.

Khandani, Amir K.; Kabal, Peter; Shaping Multidimensional Signal Spaces—Part I: Optimum Shaping, Shell Mapping; IEEE Transactions on Information Theory, vol. 39, No. 6, Nov. 1993, pp. 1799-1808.

Khandani, Amir K.; Kabal, Peter; Shaping Multidimensional Signal Spaces—Part II: Shell-Addressed Constellations; IEEE Transactions on Information Theory, vol. 39, No. 6, Nov. 1993, pp. 1809-1819.

Le Goff, Stéphane; Glavieux, Alain; Berrou, Claude; Turbo-Codes and High Spectral Efficiency Modulation; IEEE, 1994, pp. 645-649.

Wachsmann, Udo; Fischer, Robert F.H.; Huber, Johannes B.; Multilevel Codes: Theoretical Concepts and Practical Design Rules; IEEE Transactions On Information Theory, vol. 45, No. 5, Jul. 1999; pp. 1361-1391.

Papke, L., Fazel, K.; Combined Multilevel Turbo-Code With MR-Modulation; IEEE, 1995; pp. 668-672.

Khandani, A.K.; Kabal, P.; Shaping of Multi-Dimensional Signal Consellations Using a Lookup Table; IEEE, 1992; pp. 927-931.

Khandani, A.K.; An Efficient Addressing Scheme for Shaping of Multi-Dimensional Signal Constellations Using a Lookup Table; IEEE, 1994, pp. 354-357.

Kozintsev, Igor; Ramchandran, Kannan; Robust Image Transmission Over Energy-Constrained Time-Varying Channels Using Multiresolution Joint Source-Channel Coding; IEEE, 1998, pp. 1012-1026.

Schuchert, Andreas; Makowitz, Rainer; Front End Architectures for Multistandard Digital TV Receivers; IEEE Transactions on Consumer Electronics, vol. 46, No. 3, Aug. 2000, pp. 422-427.

Kirkland, W.R.; Teo, K.H.; I/Q Distortion Correction for an OFDM Direct Conversion Receiver.

Schuchert, Andreas; Hasholzner, Ralph; Buchholz; Frequency Domain Equalization of IQ Imbalance in OFDM Receivers; IEEE, 2001, pp. 28-29.

Wachsmann, Udo et al.; Multilevel Codes: Theoretical Concepts and Practical Design Rules; IEEE Transactions on Information Theory, vol. 45, No. 5, Jul. 1999; pp. 1361-1391.

Papke, L.; Fazel, K.; Combined Multilevel Turbo-Code With MR-Modulation; IEEE, 1995, pp. 668-672.

Khandani, A.K.; Kabal, P.; Shaping of Multi-Dimensional Signal Constellations Using a Lookup Table; IEEE, 1992; pp. 0927-0931.

Khandani, A.K.; An Efficient Addressing Scheme for Shaping of Multi-Dimensional Signal Constellations Using a Lookup Table; IEEE, 1994; pp. 354-357.

A K. khandani and P. Kabal; Address Decomposition for the Shaping of Multi-Dimensional Signal Constellations; IEEE, 1992, pp. 1774-1778.

Stefan H. Muller, Robert W. Bauml, Robert F. H. Fischer and Johannes B. Huber; OFDM With Reduced Peak-to-Average Power Ratio by Multiple Signal Representation; Ann. Telecommunications., 52, No. 1-2, 1997, pp. 58-67.

T. N. Zogakis and J. M. Cioffi; Application of Shaping to Discrete Multitone Modulation; IEEE, 1994, pp. 1894-1898.

A. K. Khandani and P. Kabal; Efficient, Nearly Optimum Addressing Schemes Based on Partitioning the Constellation Into the Union of Blocks; IEEE, 1993, pp. 1076-1080.

Robertson, Patrick; Worz, Thomas; Bandwidth-Efficient Turbo. Trellis-Coded Modulation Using Punctured Component Codes; IEEE Journal on Selected Areas in Communications, vol. 16, No. 2, Feb. 1998, pp. 206-218.

Khandani, Amir K.; Kabal, Peter; Shaping Multidimensional Signal Spaces—Part I: Optimum Shaping, Shell Mapping; IEEE Transactions on Information Theory, vol. 39, No. 6, Nov. 1993, pp. 1799-1808.

Khandani, Amir K.; Kabal, Peter; Shaping Multidimensional Signal Spaces—Part II: Shell-Addressed Constellations; IEEE Transactions on Information Theory, vol. 39, No. 6, Nov. 1993, pp. 1809-1819.

Le Goff, Stephane; Glavieux, Alain; Benrou, Claude: Turbo-Codes and High Spectral Efficiency Modulation: IEEE, 1994, pp. 645-649.

Wachsmann, Udo. Fisher, Robert F. H.; Huber, Johannes B.; Multilevel Codes, Theoretical Concepts and Pratical Design Rules, IEEE Transaction On Information Theory, vol. 45, No. 5, Jul. 1999; pp. 1361-1391.

Kirkland, W.R.; Teo, K.H.; I/Q Distortion Correction for an OFDM Direct Conversion Receiver.

Schuchert, Andreas; Hasholzner, Ralph: Buchholz; Frequency Domain Equalization of IQ Imbalance in OFDM Receivers: IEEE, 2001, pp. 28-29. cited by other.

P. Van Eetvelt, G. Wade and M. Tomlinson, Peak to average Power Reduction for OFDM Schemes by Selective Srambling, IEEE Electronics Letters, vol. 32, No. 21, Oct. 10, 1996, p. 1963-1964.

Bingeman, Mark; Khandani, Amir K.; Symbol-Based Turbo Codes; IEEE Communications Letters, vol. 3, No. 10, Oct. 1999, pp. 285-287.

* cited by examiner

SYSTEM AND METHOD PERFORMING QUADRATURE AMPLITUDE MODULATION BY COMBINING CO-SETS AND STRONGLY CODED CO-SET IDENTIFIERS

RELATED APPLICATIONS

This application claims the benefit of prior U.S. Provisional Application Nos. 60/314,169 and 60/314,168 filed on Aug. 23, 2001.

FIELD OF THE INVENTION

The invention relates to systems and methods for combining binary error correcting codes (such as turbo codes) and multi-level signal sets, such as QAM (Quadrature Amplitude Modulation), PSK (Phase Shift Keying), PAM (Pulse Amplitude Modulation).

BACKGROUND OF THE INVENTION

Conventional systems and methods fox the combination of binary error correcting codes (such as turbo codes) and multi-level signal sets (such as QAM) typically operate as depicted in FIG. 1. Input data is encoded, for example using Turbo Encoding. The encoded output is interleaved and mapped m bits at a time to a QAM constellation using a QAM constellation mapping which is typically a Gray mapping. The result is transmitted over a channel. At the receiver, the QAM de-mapping is performed, followed by turbo decoding.

In these schemes, Turbo decoding is achieved in two stages. First, the probability values corresponding to the bits are extracted by adding up the probability of the corresponding constellation points. Then, these bit probability values are passed to a conventional Turbo-decoder for iterative decoding. The complexity of these methods grows with the size of the constellation due to the s step required in extracting the probability values. In addition, the extra interleaving stage required between the binary encoder and the constellation (to reduce the dependency between the adjacent bits mapped to the same constellation) adds to the overall system complexity. It is well known that the coding gain of these schemes drops as the spectral efficiency increases.

Disadvantageously, noise in the QAM may result in multiple bit errors which may not be correctable. For example, in a constellation with 1024 points, capable of representing ten bits per symbol, an error in the mapping may result in up to all ten bits being in error. Most current systems map similar bit sequences to constellation points which are close to each other to mitigate this problem somewhat. Gray Mapping is an example of this.

Notwithstanding Gray mapping, the error rates achieved with such systems are still significantly less than the limit said to be theoretically achievable by Shannon's coding theorem. As QAM size increases, the coding loss becomes significant.

SUMMARY OF THE INVENTION

One broad aspect of the invention provides a method of encoding a stream of data elements. The method involves splitting the stream of data elements into a first stream and a second stream; encoding the first stream to produce a first encoded stream; performing a constellation mapping using a combination of the first encoded stream and a third stream which is based on the second stream.

In some embodiments, the constellation mapping performs a Gray mapping in mapping the third stream.

In some embodiments, the third stream is identical to the second stream.

In some embodiments, the method further involves encoding the second stream to produce the third stream using relatively weak encoding compared to that used in encoding the first stream to produce the third stream.

In some embodiments, the method further involves performing shaping on the second stream to produce the third stream.

In some embodiments, the method further involves performing shaping and channel coding on the second stream to produce the third stream with relatively weak encoding compared to that used in encoding the first stream.

In some embodiments, the encoding performed on the first stream is turbo encoding.

In some embodiments, the shaping is performed using a Huffman tree based addressing scheme to get a substantially Gaussian amplitude distribution.

In some embodiments, performing constellation shaping for a given signal constellation comprising a plurality of constellation points involves associating a cost with each of the plurality of constellation points; defining a hierarchy of blocks, the hierarchy having a plurality of layers comprising at least a first layer and a last layer, each layer having fewer blocks than each previous layer; wherein the first layer is formed by ordering all of the constellation points according to cost, and then assigning a first lowest cost group of constellation points to a first shaping partition, a second lowest cost group of constellation points to a second shaping partition dividing comprises a plurality of shaping partitions, and so on until a highest cost group of constellation points assigned to a last shaping partition, each shaping partition being assigned a cost based on the costs of the constellation points in the shaping partition, each shaping partition being a first layer block; wherein an element in each other layer is formed by combining two blocks of a previous layer and is assigned a cost based on the costs of the two blocks of the previous layer, a block of each layer being comprised of one of the elements according to cost, or a group of the elements according to cost; the last layer having a single block comprising a plurality of elements; shaping gain being achieved by only mapping to a subset of the elements of the last layer.

In some embodiments, the constellation mapping uses the data elements of the first encoded stream for least significant bits of the constellation mapping and the constellation mapping uses the data elements of the third stream for most significant bits of the constellation mapping.

In some embodiments, the method further involves defining a signal constellation comprising a plurality of constellation points; defining a plurality of co-sets within the plurality of constellation points such that a minimum distance between constellation points within each co-set is larger than a minimum distance between any constellation points within the signal constellation; performing said constellation mapping by using the first encoded stream to identify a sequence of co-sets of said plurality of co-sets, and by using the third stream to identify a sequence of constellation points within respective co-sets of the sequence of co-sets identified by said first encoded stream.

In some embodiments, labels of constellation points within each co-set are Gray mapped.

In some embodiments, the constellation mapping uses the data elements of the first encoded stream for least significant bits of the constellation mapping and the constellation mapping uses the data elements of the third stream for most significant bits of the constellation mapping.

In some embodiments, the plurality of constellation points comprises a regular array, and wherein each co-set comprises a respective set of equally spaced points within the regular array.

In some embodiments, the Turbo encoding is symbol-based Turbo encoding.

Another broad aspect of the invention provides a transmitter which has a de-multiplexer adapted to split an input stream into a first stream and a second stream; a first encoder adapted to encode the first stream to produce a first encoded stream; a constellation mapper adapted to perform constellation mapping using a combination of the first encoded stream and a third stream which is based on the second stream.

Another broad aspect of the invention provides a receiver which has a first constellation de-mapper adapted to perform de-mapping of a received signal to extract a first sub-stream; a decoder adapted to perform decoding of the first sub-stream to produced a decoded sub-stream; a re-encoder adapted to re-encode the decoded sub-stream to produce a sequence of co-set identifiers; a second constellation de-mapper adapted to perform constellation de-mapping of the received signal within co-sets of constellation points identified by the sequence of co-set to extract a second sub-stream.

Another broad aspect of the invention provides a transmitter having means for splitting a stream of data elements into a first stream and a second stream; means for encoding the first stream to produce a first encoded stream; and means for performing a constellation mapping using a combination of the first encoded stream and a third stream which is based on the second stream.

Any of the above summarized or below described embodiments can be implemented on an appropriate computer readable medium, for example a memory storage medium such as a disk. They can also be implemented in any appropriate processing platform such as a general purpose processor, custom processor or FPGA, DSP, ASTC to name a few examples.

BRIEF DESCRIPTION OF THE DRAWINGS

Preferred embodiments of the invention will be described with reference to the attached drawings in which.

DETAILED DESCRIPTION OF THE PREFERRED EMBODIMENTS

Figure 1:
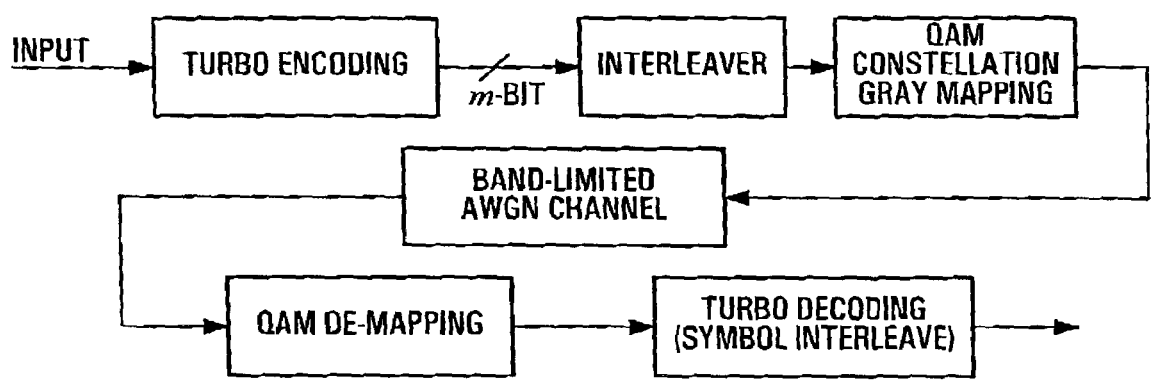
FIG. 1 is a block diagram of a conventional QAM coding scheme.
Figure 2A:
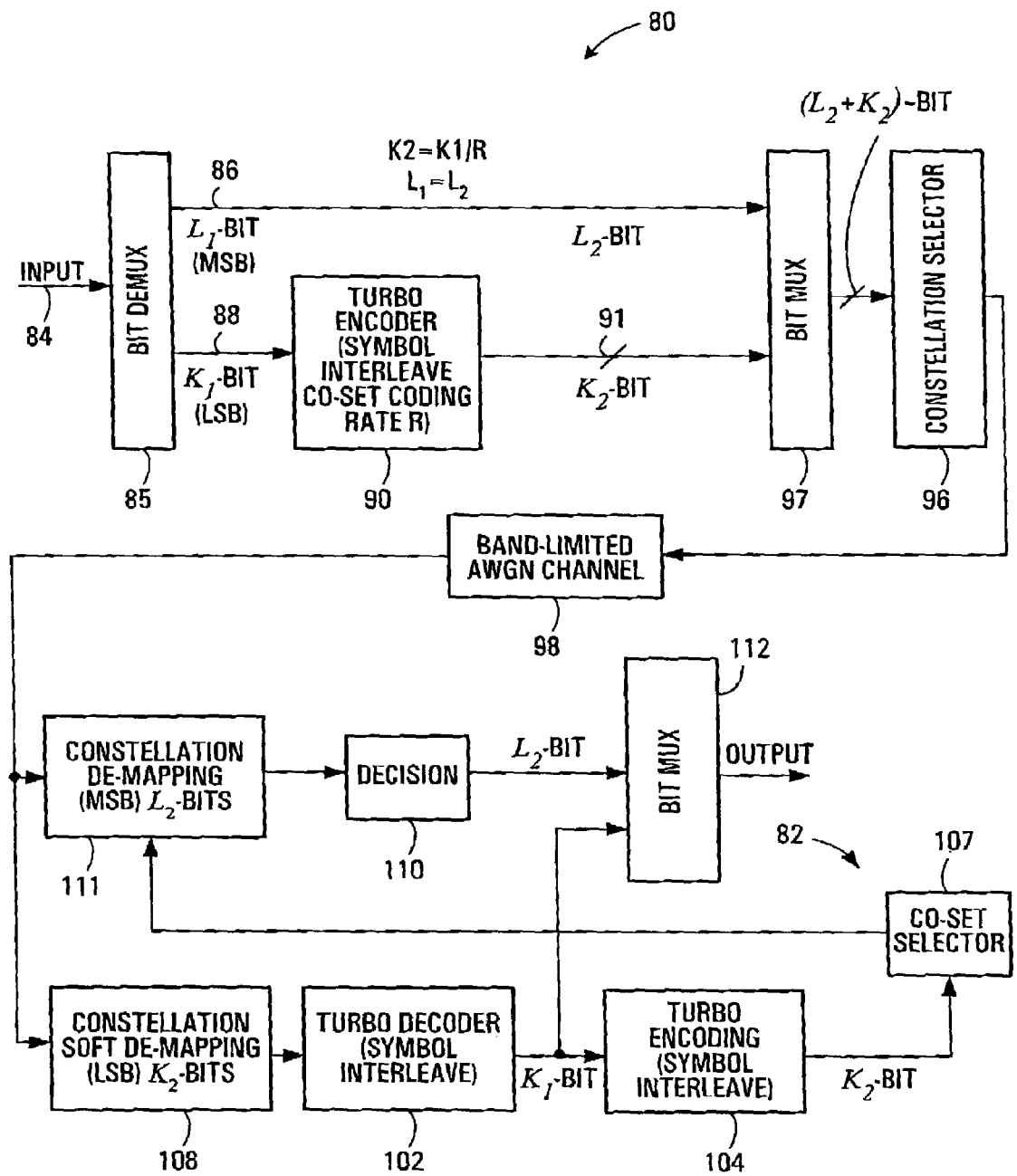
FIG. 2A is a block diagram of a constellation coding scheme provided by a first embodiment of the invention.

Referring now to FIG. 2A, a first embodiment of the invention is shown in block diagram form. Shown is transmitter/encoder functionality generally indicated by 80, a channel generally indicated by 98 which for the purpose of this example may be assumed to be a band-limited AWGN channel, and receiver/decoder functionality generally indicated by 82.

The transmitter/encoder takes an input stream 84 and splits it with bit demultiplexer 85 into first and second parallel streams 86, 88 $L_1$ and $K_1$ bits wide respectively. The second stream 88 is turbo encoded with turbo encoder 90 to produce a $K_2$-bit stream 91 or more generally is encoded by some type of encoding which is stronger than any error correction coding used for the first stream 86 which in the illustrated example has no encoding. The underlying Turbo-code is preferably a symbol-based Turbo code which preferably interleaves the bits grouped in symbols used to select the co-sets (symbol size of two bits is preferred). A constellation selector 96 (also referred to as a constellation mapper) implements a signal constellation by mapping sets of input bits to respective constellation points within the signal constellation. The constellation signal set mapped to by the constellation selector 96 is partitioned into co-sets to be selected by the group of bits (symbols) of the symbol-based Turbo-code. For example, the Turbo-code may interleave bits in pairs, and the constellation may be a PAM signal set partitioned into 4 co-sets to be selected by the 2 bits of the symbol-based Turbo-code. The properties of an example two bit by two symbol-based interleaving are presented in U.S. Pat. No. 6,298,463 entitled "Symbol-based Turbo-codes" to Bingeman et al. assigned to the same assignee as this application, and hereby incorporated by reference in its entirety. For the second parallel bit stream, $K_1/R=K_2$, where R is the coding rate of the turbo code. The two streams 86, 91 are multiplexed together in bit multiplexer 97 the output of which is input to a constellation selector 96 which operates as described by way of example below with reference to FIG. 2B. The constellation selector 96 may implement any suitable constellation, for example QAM, PAM, PSK or others. Alternatively, two separate inputs to the constellation selector 96 may be employed.

Figure 2B:
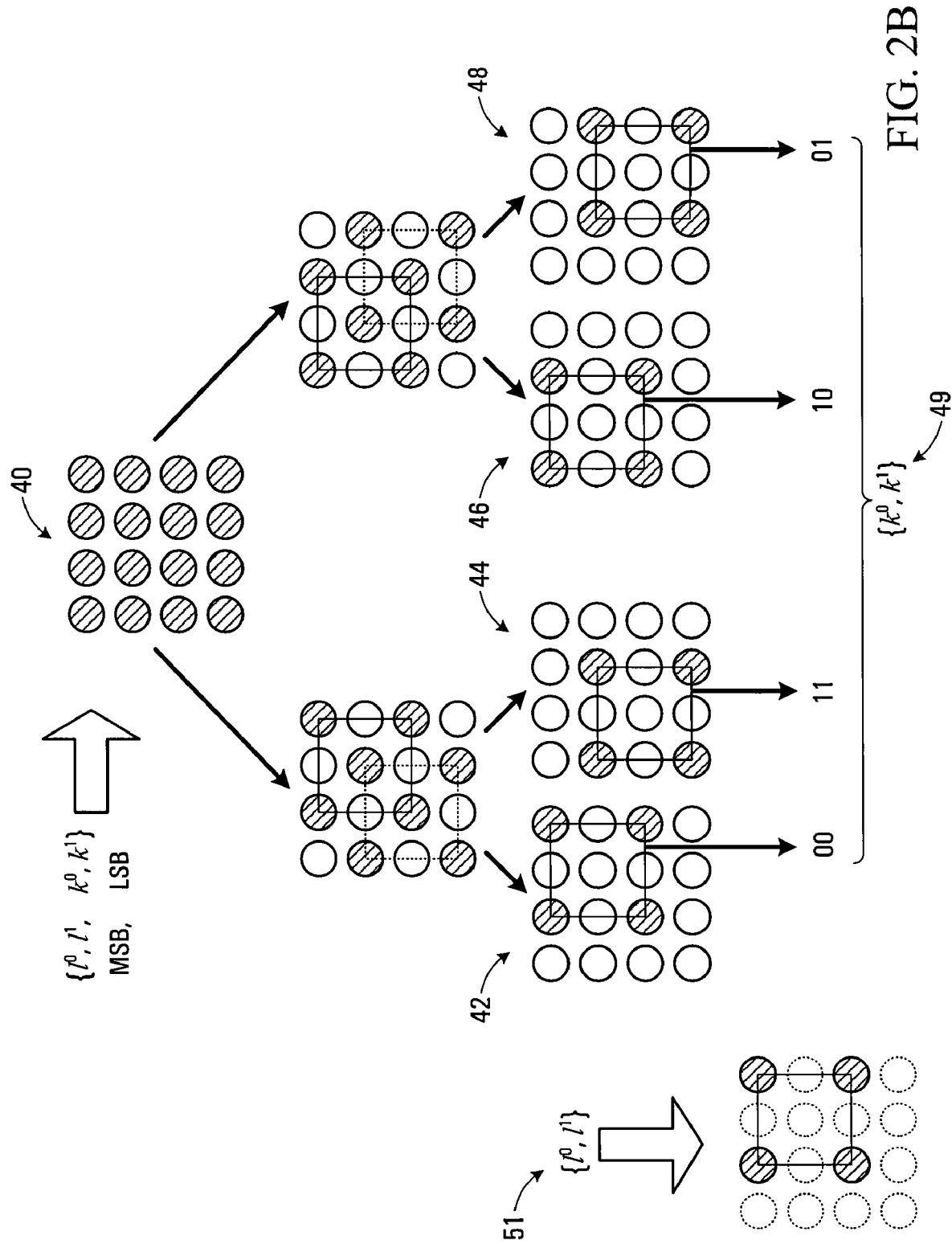
FIG. 2B is an example of how a simple QAM constellation may be used for the embodiment of FIG. 2A.

The constellation selector 96 maps to a set of $2^{L_2} \times 2^{K_7}$ possible constellation points. A physical interpretation of splitting up the bit stream in the above manner is that the available constellation points are divided up into $2^{K_2}$ different co-sets each containing $2^{L_2}$ constellation points. A simple example of such co-sets is shown in FIG. 2B for QAM modulation. In this example, $L_2=2$ and $K_2=2$, so we have a 16 QAM constellation 40 which is divided up into $2^{K_2}=4$ co-sets 42, 44, 46, 48 containing $2^{L_2}=4$ constellation points each. In this case, the input to the mapping is four bits $\{l^0, l^1, k^0, k^1\}$ of which $l^0, l^1$ are the most significant bits which originate from the uncoded stream, and of which $k^0, k^1$ are the least significant bits which originate from the coded stream. The least significant bits, indicated at 49 are used to select one of the four co-sets 42, 44, 46, 48. The most significant bits, indicated at 51 are used to select a point within the co-set identified by the least significant bits. This is illustrated for the case where the co-set 42 is selected by the least significant bits. More generally, the constellation selector 96 mapping uses the data elements of the Turbo encoded stream for a given subset of the bits (for example the least significant bits) of the constellation point labels and the constellation selector 96 uses the data elements of the remaining stream for the rest of the bits (for example the most significant bits) of the constellation point labels.

The data elements of the Turbo encoded stream 91 are used as a stream of co-set identifiers. The data elements of the first stream 86 are used to identify points within the sequence of co-sets. Preferably, a Gray mapping is employed in mapping the first stream 86 to a given co-set. This involves ensuring the mapping maps bit patterns which differ by only one bit to adjacent symbols within a co-set. This amounts to a labeling convention there is no Gray coding step or Gray de-coding step, these being inherently taken care of by the selection of labels for the constellation points.

It is noted that in FIG. 2A and subsequent figures, the various functional blocks are shown separately. More generally, these blocks may be implemented in any set of one or more physical blocks, and may be implemented for example a general purpose processor, a DSP, ASIC, FPGA or other processing platform.

Advantageously, the minimum distance of the constellation points within a given co-set can be significantly larger than the minimum distance of the constellation points within the constellation as a whole.

In FIG. 2A, at the receiver/decoder 82, first, a constellation de-mapping is performed in constellation de-mapper 108 of only the $K_2$ Turbo coded bits. Turbo decoding is performed by turbo decoder 102 to turbo decode the $K_1$ least significant bits to produce a $K_1$ bit decoded stream. The probability values required to initialize the Turbo decoder may for example be computed by adding the probability of constellation points within each co-set and then the conventional iterative decoding procedure follows. This is then re-encoded with turbo encoder 104 which is identical to the turbo encoder 90 at the input. This produces a $K_2$ bit wide sequence which is output as the sequence of co-set identifiers. These are used to select a co-set with co-set selector 107 thereby identifying a set of points which are used as the constellation for the most significant bits. Then, based on the co-set thus selected, the $L_2$ most significant bits are de-mapped with constellation soft de-mapping 111. Hard decisions are made in decision block 110 and the $L_2=L_1$ bit output is fed to a bit multiplexer 112. The $K_1$ bit output of the turbo decoder 102 is also fed to the bit multiplexer 112 the output of which is the recovered bit stream.

Figure 2C:
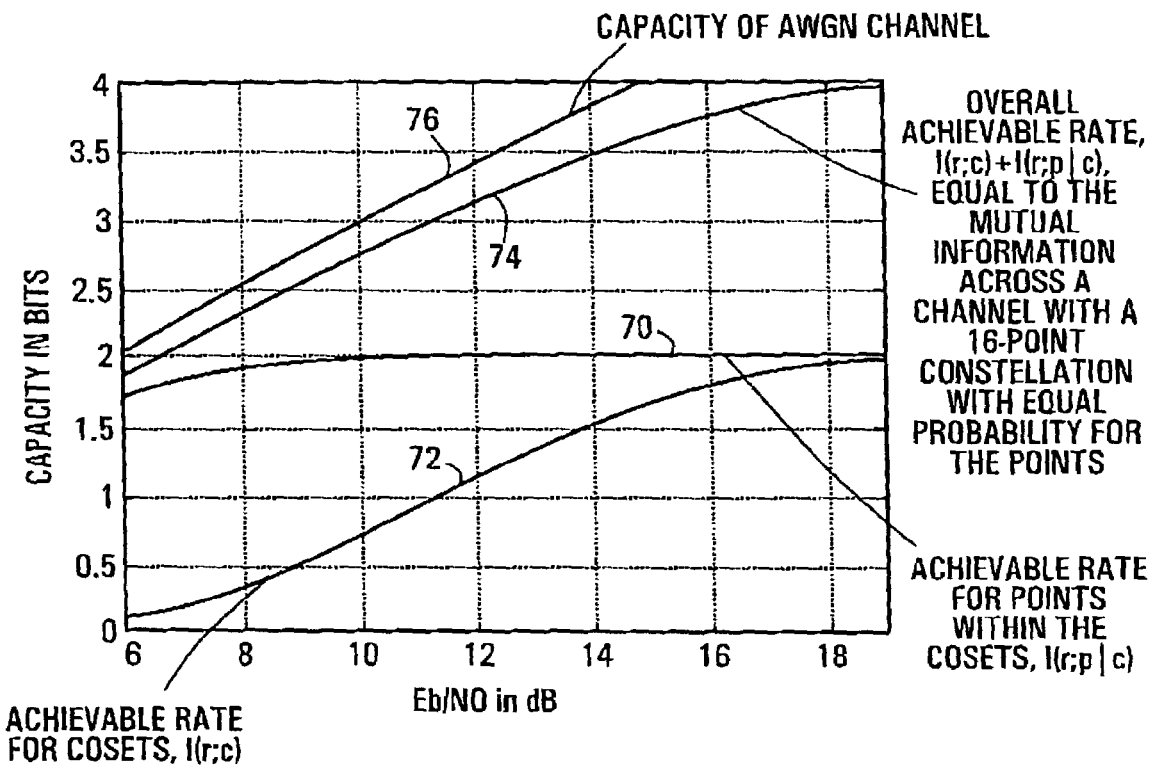
FIGS. 2C, 2D, 2E and 2F provide example performance results for the embodiment of FIG. 2A.
Figure 2D:
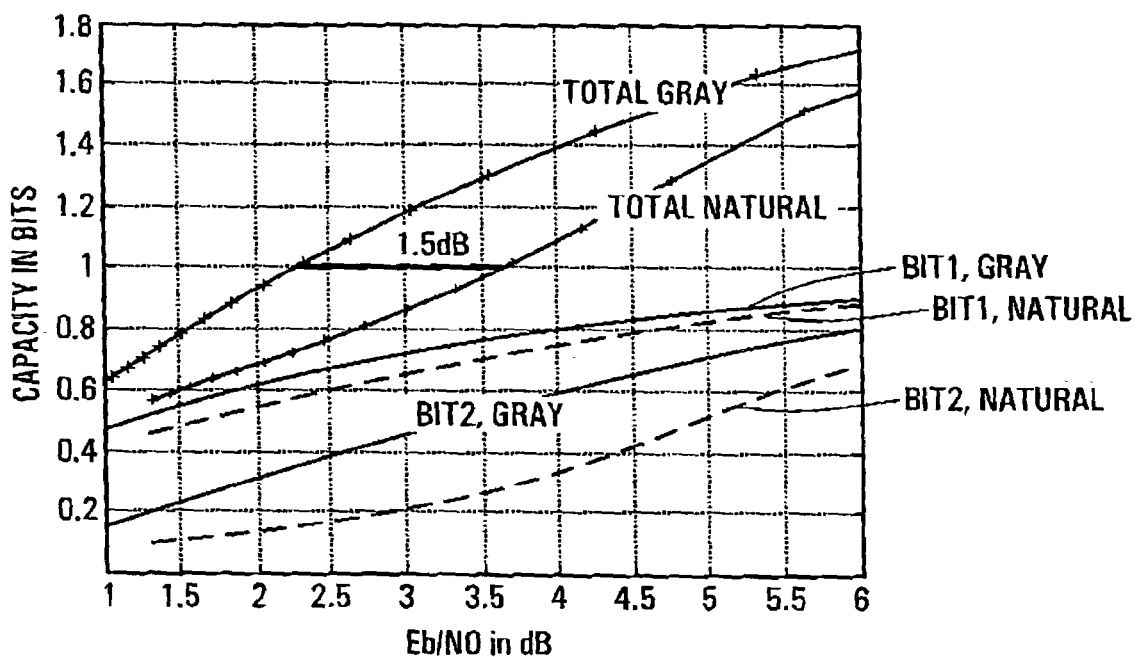
Figure 2E:
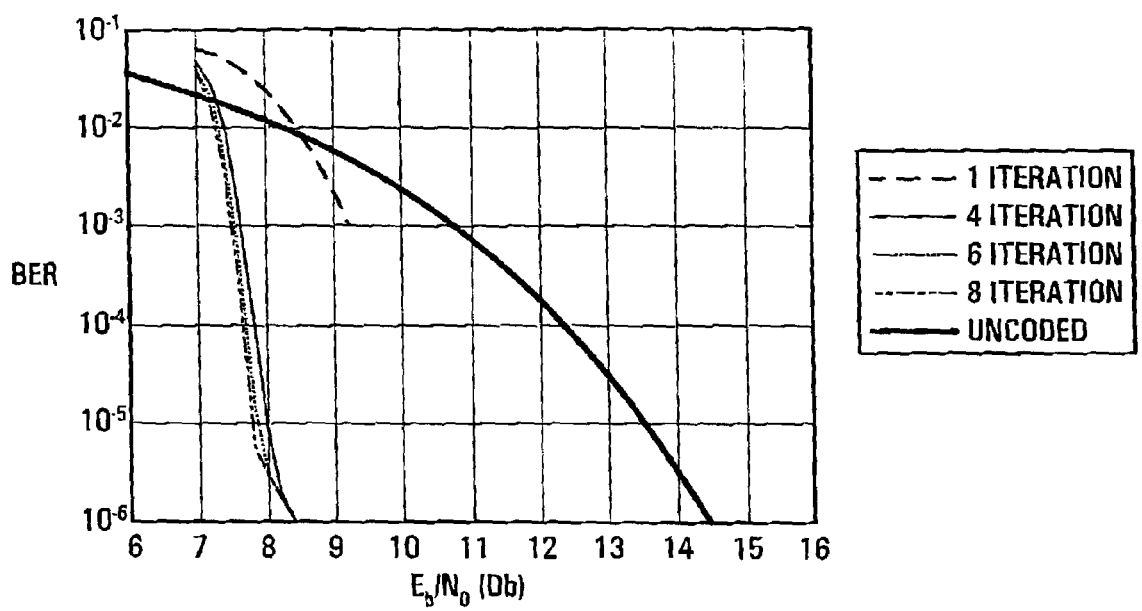
Figure 2F:
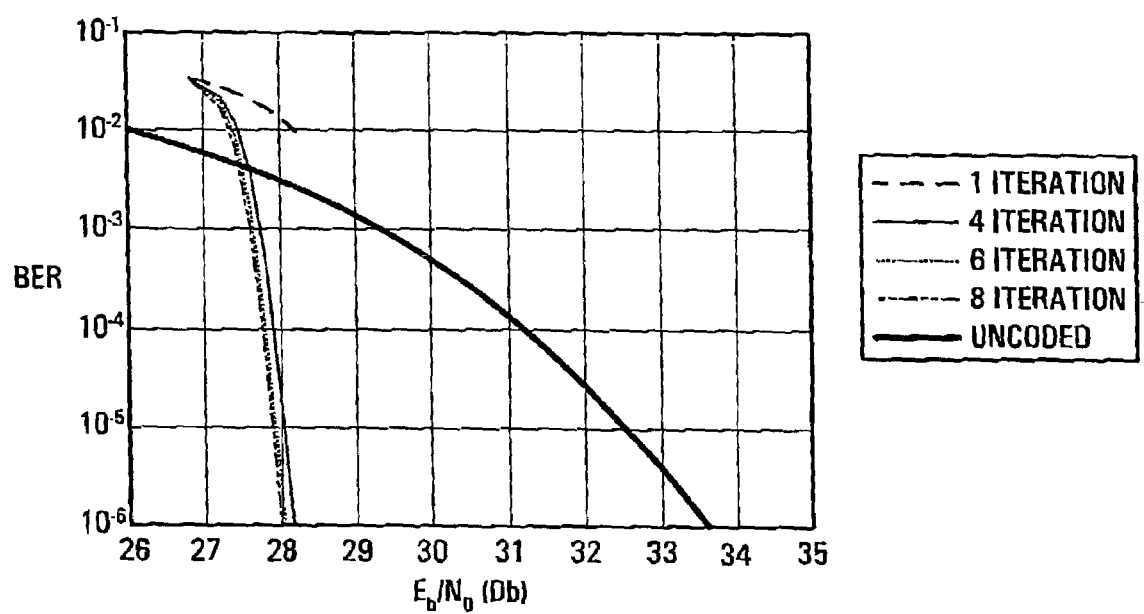

Some example performance results are shown in FIG. 2C where a 16 PAM constellation was used. The capacity for the least significant bit group (the turbo-encoded group) is plotted in curve 72, and the capacity for the most significant bit group is plotted in curve 70. The capacity for the combined channel is plotted in curve 74, and the theoretical Shannon limit for the AWGN is shown in curve 76. Similar results are shown in FIG. 2D for 4 PAM. Bit error rate performance is shown in FIGS. 2E and 2F for two examples. FIG. 2E applies for the BER of Turbo coded QAM for rate 4/6 64QAM (spectral efficiency of 4 bits/sec/Hz) with interleaver size N=2000 (bits). FIG. 2F applies for the BER of Turbo coded QAM for rate 12/14 16384 QAM (spectral efficiency of 12 bits/sec/Hz) with interleaver size N=2000 (bits).

Figure 3:
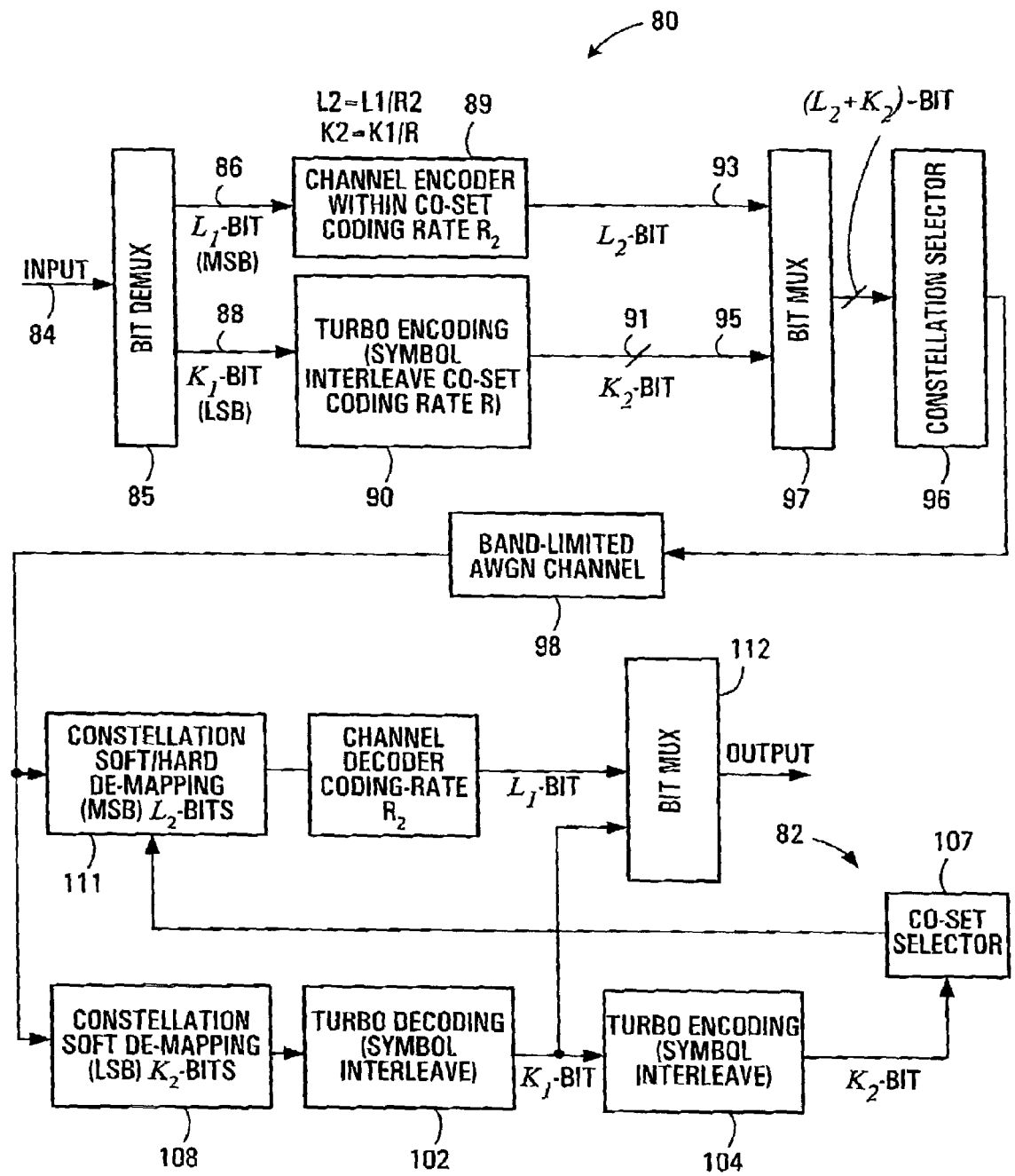
FIG. 3 is a block diagram of a constellation coding scheme provided by a second embodiment of the invention.

Referring now to FIG. 3, a second embodiment of the invention is shown in block diagram form. This embodiment has many blocks in common with the embodiment of FIG. 2A, and such blocks are identically numbered. This embodiment features a channel encoder 89 in the transmitter/encoder 80 between the bit demultiplexer 85 and the bit multiplexer 97. The channel encoder 89 may, for example, perform block coding on the $L_1$ bit stream output by the bit multiplexer 85 to produce the $L_2$ bit channel coded stream which is then input to the bit multiplexer 97. In this case, unlike in the first embodiment where $L_2=L_2$, $L_2=L_1/R_2$ where $R_2$ is the rate of the code implemented in the channel encoder 89.

As before, the second parallel stream 88 is turbo encoded with turbo encoder 90, or more generally is encoded by some type of encoding which is stronger than that used in the channel encoder 89. Where block encoding has been used in the illustrated example, more generally, any encoding which is weaker than that used for the second parallel bit stream 88 may be employed. Then, similar to the previous embodiment, the channel encoded bit stream 86 is used to select constellation points within a sequence of co-sets identified by the turbo encoded bit stream.

At the receiver/decoder 82, the processing of the turbo coded bit stream is the same as in the first embodiment described above. For the channel encoded stream, however, the constellation soft/de-mapping function 108 in this case may be soft and/or hard de-mapping function 111. This is followed by a channel decoder which decodes at rate $R_2$ to produce the $L_2$ bit stream input to the bit multiplexer 112.

Another embodiment of the invention will now be described with reference to FIG. 4. Again, this embodiment shares many blocks in common with the embodiment of FIG. 2A, and these blocks are identically numbered. On the transmitter/encoder side 80, there is optionally a channel encoder 89 performing channel coding as described above with rate $R_2$, and there is a constellation shaping block 113 which performs constellation shaping by mapping shaping bits into a sequence of shaping partitions. The order of the blocks 89, 113 may be reversed, but the preferred order is shown. The output of the constellation shaping block 113 is an $L_1'$ bit stream, and the output of the channel encoder 89 is an $L_2$ bit stream 93 which is input to the bit multiplexer 97 as before, together with the sequence of co-set identifiers generated by the turbo encoder 90. The processing for the second stream output by the bit demultiplexer 85 is the same as for the first two embodiments.

The inclusion of the constellation shaping block 113 changes the nature of the co-sets somewhat. Where in previous embodiments, the different co-sets were static entities, in this embodiment, the different co-sets are shaped by the constellation shaping block 113. In other words, the $L_2$ bits (in FIG. 4) select the sequence of shaping partitions and then the turbo coded bits select the co-sets within each shaping partition. This is guaranteed to be possible as long as each shaping partition contain and equal number of points from each co-set. A detailed example is presented below with reference to FIG. 5. Various shaping techniques may be employed. Commonly assigned U.S. application Ser. No. 10/226,172 filed the same day as this application discloses a method of shaping which may be employed. That application is hereby incorporated by reference in its entirety.

The application teaches a method of performing constellation shaping for a signal constellation comprising a plurality of constellation points. The method involves associating a cost with each of the plurality of constellation points; defining a hierarchy of blocks, the hierarchy having a plurality of layers comprising at least a first layer and a last layer, each layer having fewer blocks than each previous layer; wherein the first layer is formed by ordering all of the constellation points according to cost, and then assigning a first lowest cost group of constellation points to a first shaping partition, a second lowest cost group of constellation points to a second shaping partition dividing comprises a plurality of shaping partitions, and so on until a highest cost group of constellation points assigned to a last shaping partition, each shaping partition being assigned a cost based on the costs of the constellation points in the shaping partition, each shaping partition being a first layer block; wherein an element in each other layer is formed by combining two blocks of a previous layer and is assigned a cost based on the costs of the two blocks of the previous layer, a block of each layer being comprised of one of the elements according to cost, or a group of the elements according to cost; the last layer having a single block comprising a plurality of elements; shaping gain being achieved by only mapping to a subset of the elements of the last layer.

In some embodiments the cost assigned to each constellation point is its energy.

In some embodiments, at least some of the layers blocks are simply reordered combined blocks of a previous layer.

In some embodiments, for layers in which blocks are groups of re-ordered combined blocks of a previous layer, all groups are the same size.

In some embodiments, in at least one layer in which blocks are groups of re-ordered combined blocks of a previous layer, the groups have different sizes.

The method may further involve performing addressing by applying a first subset of a set of input bits to identify an element in the block of the highest layer; applying subsequent subsets of the set of input bits to identify blocks in subsequent layers, with a particular shaping partition being identified in the first layer; at the first layer, applying a final subset of input bits to identify a particular signal constellation point within the particular shaping partition identified in the first layer.

In some embodiments, Huffman tree based addressing is employed. In other embodiments, fixed tree based addressing is employed.

In some embodiments, a 256 point constellation is employed, there are 16 layer one partitions each comprising 16 constellation points, there are 8 layer two blocks each containing 16 elements, there are 4 layer 3 blocks each containing 8 elements, the 8 elements having sizes {16, 16, 32, 32, 32, 32, 32, 64}, there are 2 layer 4 blocks each containing 64 elements, and there is one layer 5 block containing 4096 elements.

In some embodiments, the input bits comprise a plurality of data bits and at least one dummy bit, and the method further involves repeating the method of 16 for each permutation of values of the at least one dummy bit.

In some embodiments, the method is repeated for each of a plurality of signal constellations to generate a respective plurality of shaped outputs for each signal constellation. Peak average power reduction is then performed by appropriate selection of a single shaped output from each respective plurality of shaped outputs.

Figure 4:
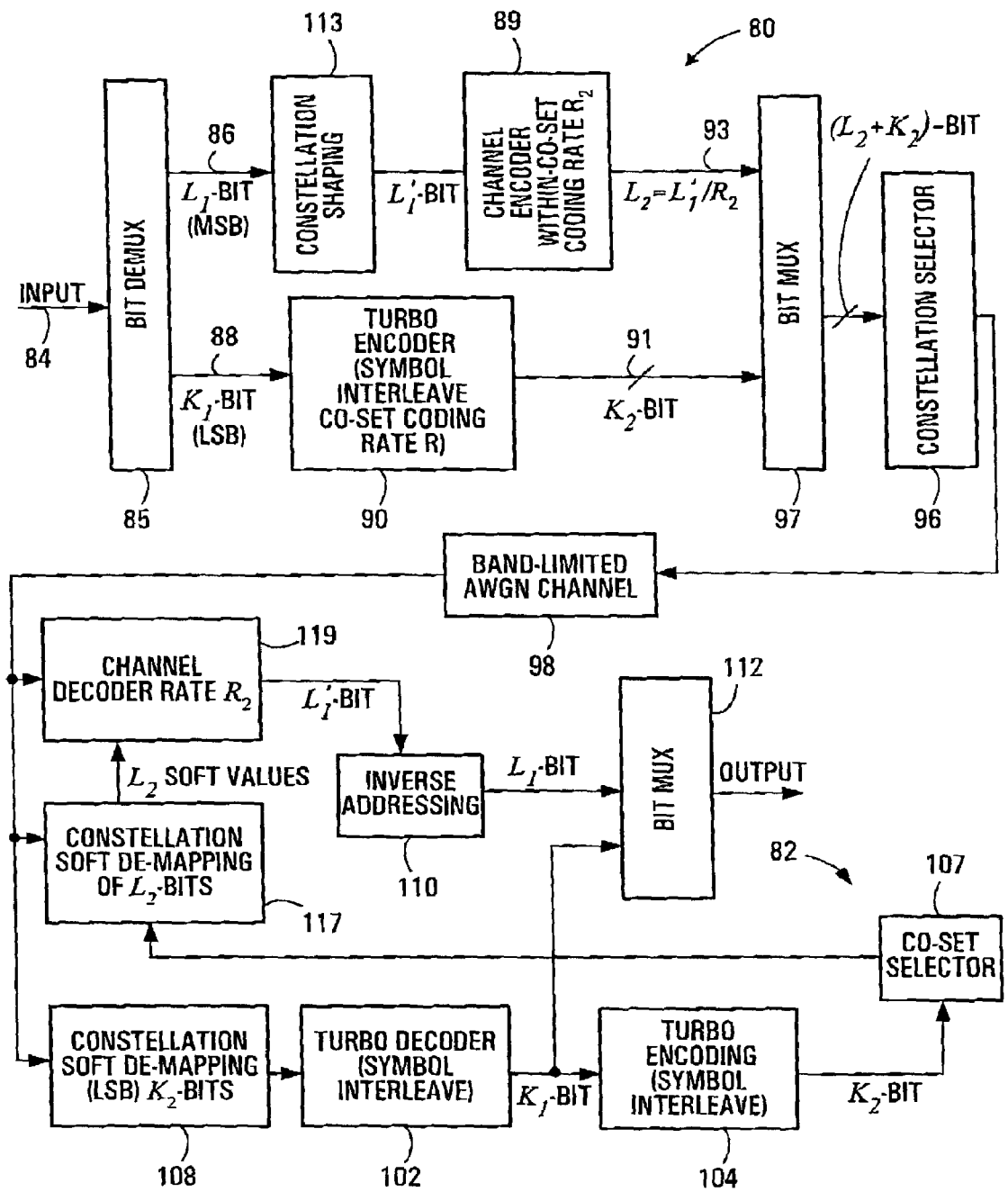
FIG. 4 is a block diagram of a constellation coding scheme provided by a third embodiment of the invention.

At the receiver 82 of FIG. 4, the decoding of the turbo encoded bits proceeds as in previous examples to produce a sequence of co-sets which is input to a constellation soft de-mapping of the remaining $L_2$ bits. The soft values output by the soft de-mapping step are input to a channel decoder which decodes the rate $R_2$ code. This outputs an $L_1'$ bit channel decoded stream which is then input to an inverse addressing block 110 which performs the opposite operation of the constellation shaping block 113 to produce the $L_1$ bit stream which is input to the bit multiplexer 112 together with the $K_1$ bit turbo decoded stream.

Figure 5:
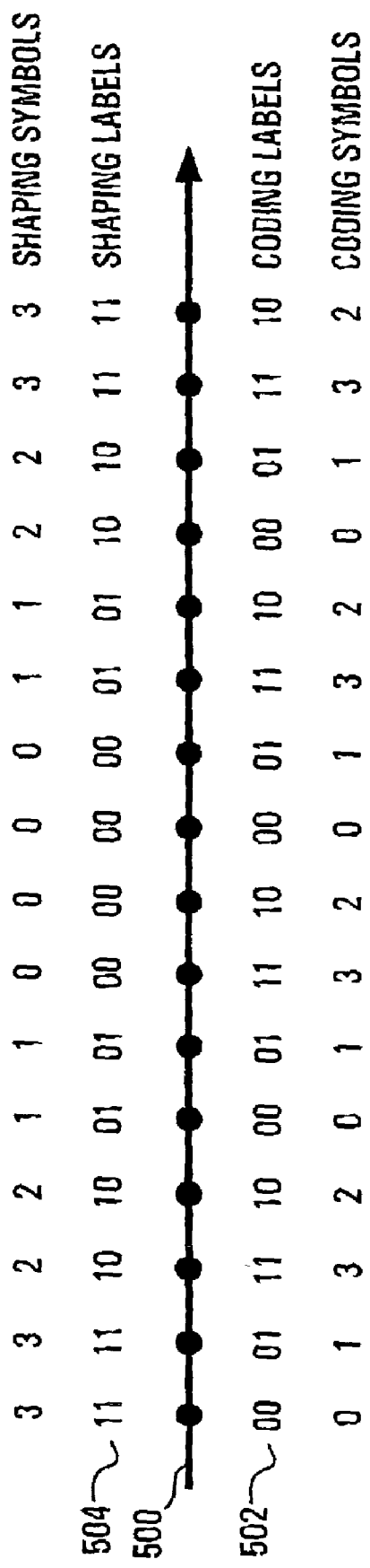
FIG. 5 is a simple example of how encoding is performed for the embodiment of FIG. 4.

FIG. 5 shows a very simple example of how mapping may be employed using the structure of FIG. 4. In this embodiment, we have a 16 PAM constellation, and the 16 PAM constellation points are shown lined up, generally indicated at 500. A 16 PAM constellation point can represent four bits. Constellation points are selected by the combination of a two bit coding label 502, and a two bit shaping label 504.

There are four shaping labels 00, 01, 10, 11. The first shaping label 00 is applied to the four PAM constellation points with lowest energy, namely those in the center of the PAM constellation. The second shaping label 01 is applied to the four PAM constellation points with the next lowest energy, these being the two on either side of the first four. The third shaping label 10 is applied to the four PAM constellation points with the next lowest energy, these being the two on either side of the second four. Finally, the last shaping label 11 is applied to the four PAM constellation points with the highest.

There are also only four coding labels in this example, i.e. only four co-set identifiers, and these are labeled 00,01,10,11. These are applied to the PAM symbols such that for each shaping label, there is exactly one symbol have each coding label/co-set identifier. More generally, there should be an equal number of points from each co-set within each shaping partition. Under this condition, it can be seen that shaping and coding work independently where the co-set identifier operates on the constellation points within the shaping partition selected by the shaping block. In the event there is more than one coding label in the same shaping partition, then extra bits employed to select between the multiple points. For example, the same labeling scheme of FIG. 5 can be employed for a 32 PAM constellation, but an extra bit from the input is then used to select between two PAM constellation points for each shaping label, coding label combination. In this case, the shaping label is used to select a particular shaping partition and then the coding label (output by turbo encoder) is used to select a co-set within that shaping partition, and in the event there is still ambiguity, the extra bits (which may also be considered part of the shaping label) are used to select the final point.

FIGS. 2A, 3 and 4 include various functionalities at the receiver for recovering the transmitted information. It is to be understood that many different receiver structures may be used to recover the information encoded using the encoding techniques shown in FIGS. 2A, 3 and 4.

In one embodiment, where shaping followed by channel encoding was employed at the transmitter, the probability values are computed for all the bits (systematic as well as parities) of the Turbo coded bits. The resulting probabilities are then mixed with the conditional probability of points within the co-sets using Bayes formula. Then, the probabilities of points are properly added to compute the probabilities of bits for the channel stream. The resulting probabilities are then passed to a soft decision decoder for the channel code acting within the co-sets. Finally, the resulting decoded bits are passed to an inverse shaping block to recover the shaping bits.

In one embodiment, where shaping followed by channel encoding was employed at the transmitter, the probability values are computed for all the bits (systematic as well as parities) of the Turbo codes bits. The resulting probabilities are then mixed with the conditional probability of points within the co-sets using Bayes formula. Then, the probabilities of points are properly added to compute the probabilities of bits for the channel coded stream. The resulting probabilities are then passed to a soft output decoder for the channel code acting within the co-sets. Finally, the resulting bit probabilities are passed to an inverse shaping block which in this case is a finite state system used to perform maximum likelihood decoding of the shaping bits. This finite state system is the same as the finite state system used to perform the addressing.

In one embodiment, where shaping followed by channel encoding was employed at the transmitter, the probability values are computed for all the bits (systematic as well as parities) of the Turbo coded bits. The resulting probabilities are then mixed with the conditional probability of points within the co-set using Bayes formula. Then, the probabilities of points are properly added to compute the probabilities of bits for the channel coded stream. The resulting probabilities are then passed to a soft output decoder for the channel code acting within the co-sets. Finally, the resulting bit probabilities are passed to an inverse shaping block which in this case is a finite state system used to perform soft output decoding of the shaping bits. This finite state system is the same as the finite state system used to perform the addressing. It is also possible to have an iterative decoding between different soft output decoders.

Numerous modifications and variations of the present invention are possible in light of the above teachings. It is therefore to be understood that within the scope of the appended claims, the invention may be practised otherwise than as specifically described herein.

We claim:

1. A method of encoding a stream of data elements comprising:
    splitting the stream of data elements into a first stream and a second stream;
    encoding the first stream using symbol-based Turbo-encoding to produce a first encoded stream;
    performing a constellation mapping using a combination of the first encoded stream and a third stream which is based on the second stream;
    encoding the second stream to produce the third stream using relatively weak encoding compared to that used in encoding the first stream, the method further comprising:
    defining a signal constellation comprising a plurality of constellation points;
    defining a plurality of co-sets within the plurality of constellation points such that a minimum distance between constellation points within each co-set is larger than a minimum distance between any constellation points within the signal constellation;
    performing said constellation mapping by using the first encoded stream to identify a sequence of co-sets of said plurality of co-sets, and by using the third stream to identify a sequence of constellation points within respective co-sets of the sequence of co-sets identified by said first encoded stream.

2. A method according to claim 1 wherein said constellation mapping performs a Gray mapping in mapping the third stream.

3. A method according to claim 2 wherein the third stream is identical to the second stream.

4. A method according to claim 2 wherein:
    the constellation mapping uses the data elements of the first encoded stream for least significant bits of the constellation mapping and the constellation mapping uses the data elements of the third stream for most significant bits of the constellation mapping.

5. A method according to claim 1 further comprising:
    performing shaping and said second encoding on the second stream to produce the third stream.

6. A method according to claim 5 wherein the shaping is performed using a Huffman tree based addressing scheme to get a substantially Gaussian amplitude distribution.

7. A method according to claim 5 wherein performing constellation shaping for a given signal constellation comprising a plurality of constellation points comprises:
    associating a cost with each of the plurality of constellation points;
    defining a hierarchy of blocks, the hierarchy having a plurality of layers comprising at least a first layer and a last layer, each layer having fewer blocks than each previous layer;
    wherein the first layer is formed by ordering all of the constellation points according to cost, and then assigning a first lowest cost group of constellation points to a first shaping partition, a second lowest cost group of constellation points to a second shaping partition, and so on until a highest cost group of constellation points assigned to a last shaping partition, each shaping partition being assigned a cost based on the costs of the constellation points in the shaping partition, each shaping partition being a first layer block;
    wherein an element in each other layer is formed by combining two blocks of a previous layer and is assigned a cost based on the costs of the two blocks of the previous layer, a block of each layer being comprised of one of the elements according to cost, or a group of the elements according to cost;
    the last layer having a single block comprising a plurality of elements;
    shaping gain being achieved by only mapping to a subset of the elements of the last layer.

8. A method according to claim 1 wherein labels of constellation points within each co-set are Gray mapped.

9. A method according to claim 1 wherein the constellation mapping uses the data elements of the first encoded stream for least significant bits of the constellation mapping and the constellation mapping uses the data elements of the third stream for most significant bits of the constellation mapping.

10. A method according to claim 1 wherein the plurality of constellation points comprises a regular array, and wherein each co-set comprises a respective set of equally spaced points within the regular array.

11. A transmitter comprising:
    a de-multiplexer adapted to split an input stream into a first stream and a second stream;
    a first encoder adapted to encode the first stream using symbol-based Turbo-encoding to produce a first encoded stream;
    a second encoder adapted to encode a second stream to produce a third stream using relatively weak encoding compared to that used in the first encoder;
    a constellation mapper adapted to perform constellation mapping using a combination of the first encoded stream and the third stream which is based on the second stream, wherein:
    the constellation mapper is adapted to map to a signal constellation comprising a plurality of constellation points within which is defined a plurality of co-sets such that a minimum distance between constellation points within each co-set is larger than a minimum distance between any constellation points within the signal constellation;
    the constellation mapper is adapted to use the first encoded stream to identify a sequence of co-sets of said plurality of co-sets; and
    the constellation mapper is adapted to use the third stream to identify a sequence of constellation points within respective co-sets of the sequence of co-sets identified by said first encoded stream.

12. A transmitter according to claim 11 wherein the constellation mapper performs Gray mapping in mapping the third stream.

13. A transmitter according to claim 11 wherein the third stream is identical to the second stream.

14. A transmitter according to claim 11 further comprising:
    a shaper, the shaper and the second encoder adapted to perform shaping and encoding on the second stream to produce the third stream.

15. A transmitter according to claim 14 wherein the shaper is adapted to perform constellation shaping for a given signal constellation comprising a plurality of constellation points by:
  associating a cost with each of the plurality of constellation points;
  defining a hierarchy of blocks, the hierarchy having a plurality of layers comprising at least a first layer and a last layer, each layer having fewer blocks than each previous layer;
  wherein the first layer is formed by ordering all of the constellation points according to cost, and then assigning a first lowest cost group of constellation points to a first shaping partition, a second lowest cost group of constellation points to a second shaping partition, and so on until a highest cost group of constellation points assigned to a last shaping partition, each shaping partition being assigned a cost based on the costs of the constellation points in the shaping partition, each shaping partition being a first layer block;
  wherein an element in each other layer is formed by combining two blocks of a previous layer and is assigned a cost based on the costs of the two blocks of the previous layer, a block of each layer being comprised of one of the elements according to cost, or a group of the elements according to cost;
  the last layer having a single block comprising a plurality of elements;
  shaping gain being achieved by only mapping to a subset of the elements of the last layer.

16. A transmitter according to claim 11 wherein the constellation mapper uses the data elements of the first encoded stream for least significant bits of the constellation mapping and the constellation mapper uses the data elements of the third stream for most significant bits of the constellation mapping.

17. A transmitter according to claim 11 wherein the plurality of constellation points comprises a rectangular array, and wherein each co-set comprises a respective set of equally spaced points within the rectangular array.

18. A method of encoding a stream of data elements comprising:
  splitting the stream of data elements into a first stream and a second stream;
  encoding the first stream using Turbo-encoding to produce a first encoded stream;
  performing a constellation mapping using a combination of the first encoded stream and a third stream which is based on the second stream;
  encoding the second stream to produce the third stream using relatively weak encoding compared to that used in encoding the first stream, the method further comprising:
    defining a signal constellation comprising a plurality of constellation points;
    defining a plurality of co-sets within the plurality of constellation points such that a minimum distance between constellation points within each co-set is larger than a minimum distance between any constellation points within the signal constellation;
    performing said constellation mapping by using the first encoded stream to identify a sequence of co-sets of said plurality of co-sets, and by using the third stream to identify a sequence of constellation points within respective co-sets of the sequence of co-sets identified by said first encoded stream.

19. A method according to claim 18 wherein labels of constellation points within each co-set are Gray mapped.

20. A method according to claim 18 wherein the constellation mapping uses the data elements of the first encoded stream for least significant bits of the constellation mapping and the constellation mapping uses the data elements of the third stream for most significant bits of the constellation mapping.

21. A method according to claim 18 wherein the plurality of constellation points comprises a regular array, and wherein each co-set comprises a respective set of equally spaced points within the regular array.

22. A method according to claim 18 wherein said constellation mapping performs a Gray mapping in mapping the third stream.

23. A method according to claim 22 wherein the third stream is identical to the second stream.

24. A method according to claim 22 wherein:
  the constellation mapping uses the data elements of the first encoded stream for least significant bits of the constellation mapping and the constellation mapping uses the data elements of the third stream for most significant bits of the constellation mapping.

25. A method according to claim 18 further comprising:
  performing shaping and said second encoding on the second stream to produce the third stream.

26. A method according to claim 25 wherein the shaping is performed using a Huffman tree based addressing scheme to get a substantially Gaussian amplitude distribution.

27. A method according to claim 25 wherein performing constellation shaping for a given signal constellation comprising a plurality of constellation points comprises:
  associating a cost with each of the plurality of constellation points;
  defining a hierarchy of blocks, the hierarchy having a plurality of layers comprising at least a first layer and a last layer, each layer having fewer blocks than each previous layer;
  wherein the first layer is formed by ordering all of the constellation points according to cost, and then assigning a first lowest cost group of constellation points to a first shaping partition, a second lowest cost group of constellation points to a second shaping partition, and so on until a highest cost group of constellation points assigned to a last shaping partition, each shaping partition being assigned a cost based on the costs of the constellation points in the shaping partition, each shaping partition being a first layer block;
  wherein an element in each other layer is formed by combining two blocks of a previous layer and is assigned a cost based on the costs of the two blocks of the previous layer, a block of each layer being comprised of one of the elements according to cost, or a group of the elements according to cost;
  the last layer having a single block comprising a plurality of elements;
  shaping gain being achieved by only mapping to a subset of the elements of the last layer.

28. A transmitter comprising:
  a de-multiplexer adapted to split an input stream into a first stream and a second stream;
  a first encoder adapted to encode the first stream using Turbo-encoding to produce a first encoded stream;
  a second encoder adapted to encode a second stream to produce a third stream using relatively weak encoding compared to that used in the first encoder;

a constellation mapper adapted to perform constellation mapping using a combination of the first encoded stream and the third stream which is based on the second stream, wherein:

the constellation mapper is adapted to map to a signal constellation comprising a plurality of constellation points within which is defined a plurality of co-sets such that a minimum distance between constellation points within each co-set is larger than a minimum distance between any constellation points within the signal constellation;

the constellation mapper is adapted to use the first encoded stream to identify a sequence of co-sets of said plurality of co-sets; and the constellation mapper is adapted to use the third stream to identify a sequence of constellation points within respective co-sets of the sequence of co-sets identified by said first encoded stream.

29. A transmitter according to claim 28 wherein the constellation mapper performs Gray mapping in mapping the third stream.

30. A transmitter according to claim 28 further comprising:
a shaper, the shaper and the second encoder adapted to perform shaping and encoding on the second stream to produce the third stream.

31. A transmitter according to claim 30 wherein the shaper is adapted to perform constellation shaping for a given signal constellation comprising a plurality of constellation points by:

associating a cost with each of the plurality of constellation points;

defining a hierarchy of blocks, the hierarchy having a plurality of layers comprising at least a first layer and a last layer, each layer having fewer blocks than each previous layer;

wherein the first layer is formed by ordering all of the constellation points according to cost, and then assigning a first lowest cost group of constellation points to a first shaping partition, a second lowest cost group of constellation points to a second shaping partition, and so on until a highest cost group of constellation points assigned to a last shaping partition, each shaping partition being assigned a cost based on the costs of the constellation points in the shaping partition, each shaping partition being a first layer block;

wherein an element in each other layer is formed by combining two blocks of a previous layer and is assigned a cost based on the costs of the two blocks of the previous layer, a block of each layer being comprised of one of the elements according to cost, or a group of the elements according to cost;

the last layer having a single block comprising a plurality of elements;

shaping gain being achieved by only mapping to a subset of the elements of the last layer.

32. A method of encoding a stream of data elements comprising:

splitting the stream of data elements into a first stream and a second stream;

encoding the first stream using symbol-based Turbo-encoding to produce a first encoded stream;

performing a constellation mapping using a combination of the first encoded stream and a third stream which is based on the second stream;

encoding the second stream to produce the third stream using relatively weak encoding compared to that used in encoding the first stream, the method further comprising:

performing shaping and said second encoding on the second stream to produce the third stream;

wherein performing constellation shaping for a given signal constellation comprising a plurality of constellation points comprises:

associating a cost with each of the plurality of constellation points;

defining a hierarchy of blocks, the hierarchy having a plurality of layers comprising at least a first layer and a last layer, each layer having fewer blocks than each previous layer;

wherein the first layer is formed by ordering all of the constellation points according to cost, and then assigning a first lowest cost group of constellation points to a first shaping partition, a second lowest cost group of constellation points to a second shaping partition, and so on until a highest cost group of constellation points assigned to a last shaping partition, each shaping partition being assigned a cost based on the costs of the constellation points in the shaping partition, each shaping partition being a first layer block;

wherein an element in each other layer is formed by combining two blocks of a previous layer and is assigned a cost based on the costs of the two blocks of the previous layer, a block of each layer being comprised of one of the elements according to cost, or a group of the elements according to cost;

the last layer having a single block comprising a plurality of elements;

shaping gain being achieved by only mapping to a subset of the elements of the last layer.

* * * * *